(12) United States Patent
Schloesser et al.

(10) Patent No.: US 7,109,544 B2
(45) Date of Patent: Sep. 19, 2006

(54) ARCHITECTURE FOR VERTICAL TRANSISTOR CELLS AND TRANSISTOR-CONTROLLED MEMORY CELLS

(75) Inventors: Till Schloesser, Dresden (DE); Dirk Manger, Dresden (DE); Bernd Goebel, Dresden (DE)

(73) Assignee: Infineon Technologies AG, Munich (DE)

( * ) Notice: Subject to any disclaimer, the term of this patent is extended or adjusted under 35 U.S.C. 154(b) by 43 days.

(21) Appl. No.: 10/777,128

(22) Filed: Feb. 13, 2004

(65) Prior Publication Data

US 2005/0001257 A1    Jan. 6, 2005

(30) Foreign Application Priority Data

Feb. 14, 2003  (DE) ................................ 103 06 281

(51) Int. Cl.
*H01L 27/108*  (2006.01)

(52) U.S. Cl. ........................ 257/302; 257/296; 257/301

(58) Field of Classification Search ................ 257/296, 257/301, 302
See application file for complete search history.

(56) References Cited

U.S. PATENT DOCUMENTS

| | | | |
|---|---|---|---|
| 4,250,519 A | 2/1981 | Mogi et al. | |
| 4,630,088 A | 12/1986 | Ogura et al. | |
| 4,663,644 A | 5/1987 | Shimizu | |
| 4,862,240 A * | 8/1989 | Watanabe et al. | 257/370 |
| 5,502,320 A | 3/1996 | Yamada | |
| 5,736,761 A | 4/1998 | Risch et al. | |
| 6,033,957 A | 3/2000 | Burns, Jr. et al. | |
| 6,044,009 A * | 3/2000 | Goebel et al. | 365/149 |
| 6,255,684 B1 * | 7/2001 | Roesner et al. | 257/302 |
| 6,352,684 B1 * | 3/2002 | Purewal et al. | 424/45 |
| 6,355,520 B1 | 3/2002 | Park et al. | |
| 6,492,221 B1 | 12/2002 | Hofmann et al. | |
| 2001/0032991 A1 * | 10/2001 | Hofmann | 257/300 |
| 2002/0109178 A1 | 8/2002 | Forbes et al. | |

FOREIGN PATENT DOCUMENTS

| | | |
|---|---|---|
| DE | 195 19 159 A1 | 11/1996 |
| DE | 198 45 004 A1 | 4/2000 |
| DE | 101 28 928 A1 | 1/2002 |
| DE | 101 25 967 C1 | 7/2002 |
| JP | 61140170 A | 6/1986 |

* cited by examiner

*Primary Examiner*—Andy Huynh
(74) *Attorney, Agent, or Firm*—Slater & Matsil, L.L.P.

(57) ABSTRACT

In a substrate vertical transistor cells are formed and are arranged, in a transistor cell array, row by row in an x direction and column by column in a y direction. Lower source/drain regions of the transistor cells are connected to a common connection plate. Upper source/drain regions of the transistor cells impart a contact connection for instance to a storage capacitor of a DRAM memory cell. Active trenches running between the transistor cells with word lines are formed along the x direction. The word lines form gate electrodes in sections. A potential at the gate electrode controls a conductive channel in an active region arranged in each case between the upper and the lower source/drain connection region. According to the invention, the active regions of adjacent transistor cells are sections of a contiguous layer body and are connected to one another. An accumulation of charge carriers in the active region and floating body effects are avoided without increasing the area requirement of a transistor cell.

20 Claims, 13 Drawing Sheets

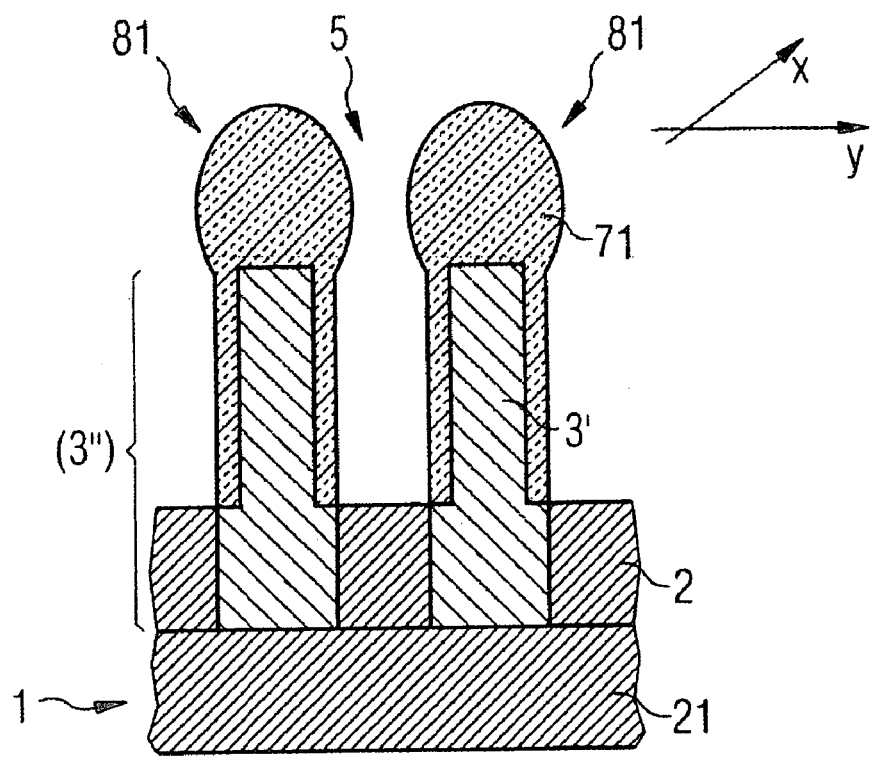
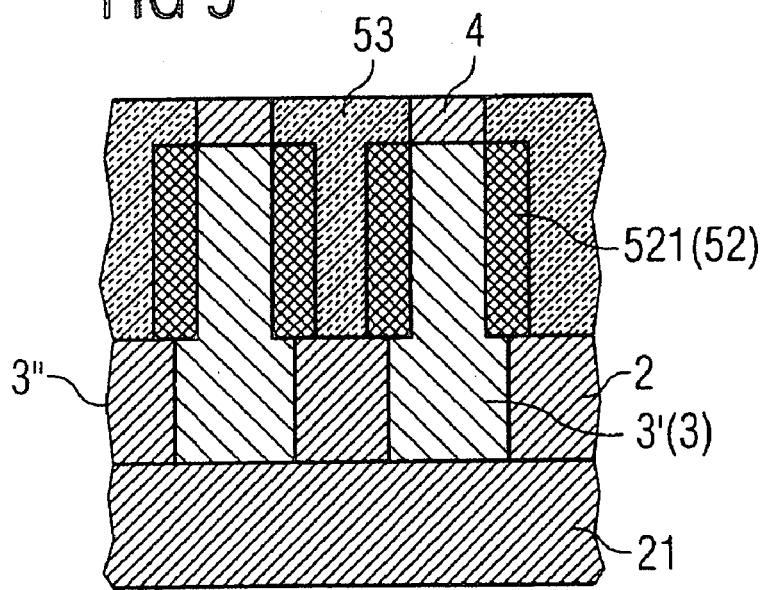

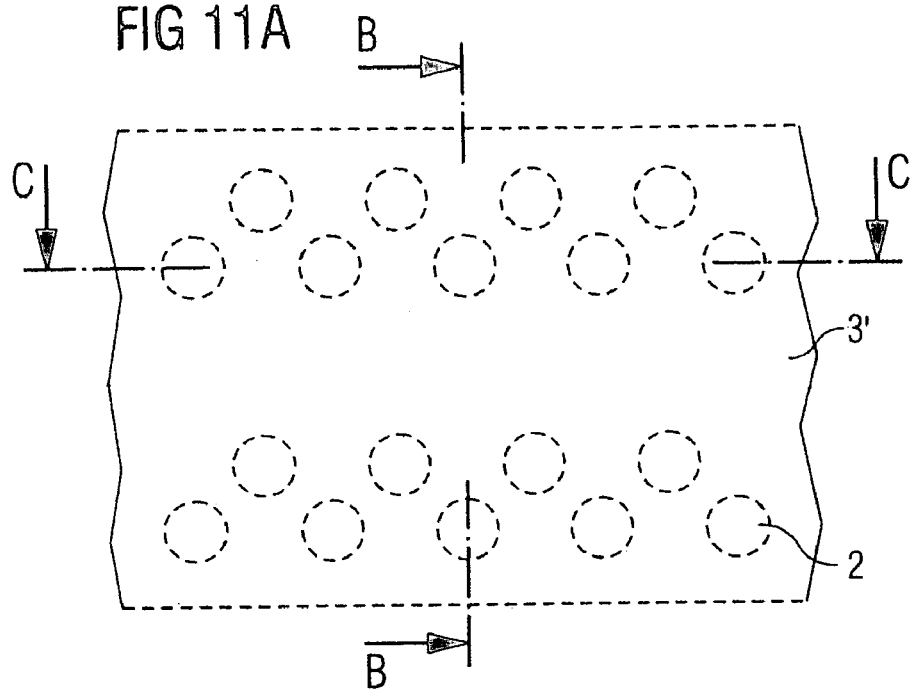
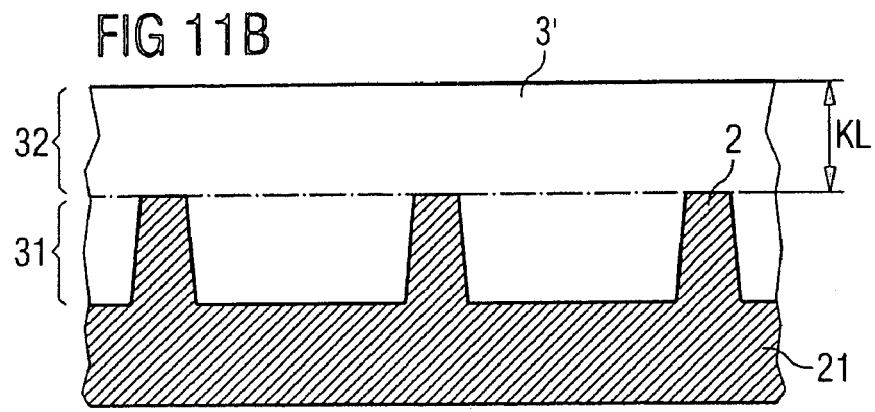
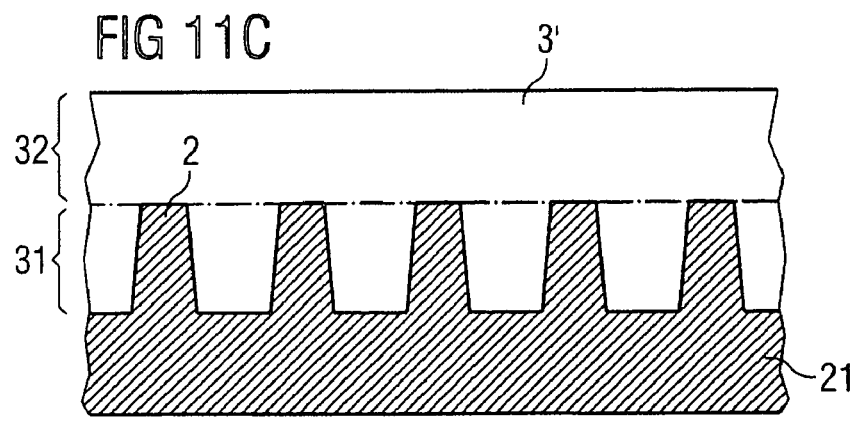

ARCHITECTURE FOR VERTICAL TRANSISTOR CELLS AND TRANSISTOR-CONTROLLED MEMORY CELLS

BACKGROUND

1. Field of the Invention

The present invention relates generally to semiconductor devices and in particular to semiconductor memory architecture.

2. Background of the Invention

Memory cells of dynamic random access memories (DRAMs) are usually designed as one transistor/one capacitor (1T1C) memory cells each having a storage capacitor for storing charge carriers and a selection transistor for addressing the storage capacitor. In the case of memory cells of the "trench capacitor" type, the storage capacitors are arranged in the substrate essentially below a transistor plane formed by the selection transistors and, in the case of memory cells of the "stacked capacitor" type, essentially above the transistor plane.

To increase the performance of DRAMs, both miniaturization of the feature sizes and achieving a smallest possible spacing between memory cells relative to a minimum feature size F is desirable. The minimum feature size may be reduced in lithography-dictated steps, in which case memory cell concepts can be transferred from a larger minimum feature size to a smaller minimum feature size without additional changes beyond shrinking of the memory cell structures to scale. Well-scalable memory cell concepts are advantageous since an additional outlay for changes in a layout of the memory cell structures over and above adaptations that are purely to scale is limited in the event of a transition to a smaller feature size.

A known approach to reducing the space requirement of a memory cell, is to provide the selection transistor in a structure that is vertical with respect to the transistor plane. In this case, the source/drain connection regions (S/D junctions) are arranged essentially vertically one above the other relative to the transistor plane. A channel controlled by a gate electrode of the selection transistor is then formed, principally in a direction perpendicular to the transistor plane, in an active region of the selection transistor which is provided between the two source/drain connection regions of the selection transistor. An architecture having vertical transistor cells is disclosed for example in U.S. Pat. No. 6,352,894 B1 (Goebel et al.) and illustrated in FIG. 1, which is adapted from the Figures of the above patent specification.

FIG. 1 shows a plurality of transistor cells 81 arranged on a substrate 1. In this case, each transistor cell 81 has an upper source/drain connection region 4 and a lower source/drain connection region 2. An active region (also called body region) 3 is in each case formed between upper 4 and lower 2 source/drain connection regions. transistor cells 81 are respectively arranged in rows and columns arranged at right angles to one another, the rows extending along an x direction and the columns extending along a y direction perpendicular to the x direction. Within a row, respectively adjacent transistor cells 81 are separated by narrow isolation trenches 6. Adjacent rows are isolated from one another by wide active trenches 5. First sections of gate electrodes 52 are formed in narrow isolation trenches 6. Two mutually insulated word lines 521, 522 which are respectively assigned to one of the adjacent rows pass through wide active trenches 5, said word lines forming second sections of gate electrodes 52. Gate electrodes 52 respectively arranged in a row are conductively connected to one another via word lines 521, 522. Gate electrode 52 of each transistor cell 81 surrounds active region 3 from four sides. Lower source/drain connection regions 2 of transistor cells 81 are formed as sections of a connection plate (buried plate) 21, which, in an upper region, is patterned by active trenches 5 and isolation trenches 6, and are electrically conductively connected to one another. Gate electrode 52 of a transistor cell 81 is insulated from active region 3 of assigned transistor cell 81 by a gate dielectric 51. An insulator layer 50 insulates source/drain connection regions 2, 4 from adjoining conductive structures and is opened section by section for the connection of the upper source/drain connection regions, for instance to an electrode of a storage capacitor, in the course of a further processing.

A disadvantage of the illustrated architecture of transistor cells 81 is that active regions 3 of transistor cells 81 are electrically without connection.

If, in the operating state of a transistor cell, a channel controlled by a potential at the gate electrode is formed in the active region of the transistor cell, then majority carriers do not flow away from the active region in transistor cells without electrical connection of the active region. However, an accumulation of majority carriers in the active region disadvantageously alters the electrical properties of the transistor cell. In particular, an accumulated charge in the active region can activate a parasitic bipolar transistor which, under specific operating conditions of an architecture of memory cells, may cause a leakage current to or from the source/drain connection region oriented toward the storage capacitor (floating body effect). As a result, a charge stored on the storage capacitor is altered and a datum represented by the charge and stored in the memory cell is corrupted, if the storage capacitor is not recharged within a specified time. Each recharging process increases an average access time to the datum stored in the memory cell and the power consumption of the memory cell.

With the transistor cell architecture illustrated in FIG. 1 it is possible, with a minimum feature size F, to produce memory cells with a planar area requirement of $4\,F^2$, or $8\,F^2$ in the case of memory concepts with a so-called folded bit line structure. An additional connection for the active region of each transistor cell according to a conventional type would considerably increase the area requirement of the transistor cell.

SUMMARY

Embodiments of the present invention provide for a transistor cell architecture and memory cell architecture in which a functional restriction of the transistor cells by a floating body effect is reduced without increasing an area requirement significantly, with respect to conventional memory cell concepts for $4\,F^2$ or $8\,F^2$ transistor cells or $4\,F^2$ or $8\,F^2$ memory cells. Further embodiments include a method for fabricating such a transistor cell or memory cell.

In an exemplary embodiment of the present invention, vertical transistor cells are arranged in a transistor cell array, in a transistor plane, in a manner that is initially known. The transistor cells are arranged in rows in an x direction, said rows being separated from one another by active trenches, and in columns in a y direction perpendicular to the x direction, said columns being separated by isolation trenches. Each transistor cell has a lower source/drain connection region, an upper source/drain connection region and an active region formed between the lower and the upper source/drain connection region. A formation of a conductive channel between the two source/drain connection regions is controlled in the active region, in the operating state of the transistor cell, in a manner dependent on a potential at a gate electrode which is insulated from the active region by a gate dielectric.

The active regions at least of transistor cells which are adjacent to one another in the x direction are now connected to one another, enabling a charge carrier transport between the active regions of transistor cells which are adjacent at least in each case in the x direction. Floating body effects are avoided.

Preferably, the gate electrodes are arranged in the active trenches. The gate electrodes of transistor cells which are adjacent in each case in the x direction are connected to one another and form word lines.

In another exemplary embodiment of the present invention, a method for fabricating vertical transistor cells in a substrate comprises arranging said transistor cells in a transistor cell array in rows along an x direction and in columns along a y direction perpendicular to the x direction and firstly providing a conductive connection plate in the substrate. A precursor layer body is arranged on the conductive connection plate. Isolation trenches extending along the y direction are introduced into an upper region of the precursor layer body, wherein transistor cells adjacent in the x direction are separated from one another by said isolation trenches. Furthermore, active trenches which cut through the precursor layer body and pattern the connection plate in an upper region are introduced into the precursor layer body. In this case, layer bodies separated by the active trenches emerge from the precursor layer body. Lower source/drain connection regions arise from the upper regions of the connection plate. Active regions of the transistor cells which are connected to one another by means of the lower regions of the layer bodies row by row emerge from the upper regions of the layer bodies.

In a further exemplary embodiment of the present invention, a method for fabricating vertical transistor cells in a substrate comprises arranging said transistor cells in a transistor cell array, in rows along an x direction and in columns along a y direction perpendicular to the x direction, and firstly providing a conductive connection plate in the substrate. Additionally, the connection plate is then patterned in an upper region in such a way that a lower source/drain connection region which is delimited both in the x direction and in the y direction is produced in the upper region per transistor cell. Furthermore, a contiguous layer body which is patterned by the lower source/drain connection regions in a lower region is arranged on the connection plate, in the upper region of which layer body active regions of the transistor cells are formed. Since the layer body is not divided into mutually separated layer bodies respectively assigned to a transistor row, the active regions of transistor cells adjacent in the x direction as well as transistor cells adjacent in the y direction, for example, comprising all the transistor cells of a transistor cell array, can be connected to one another in this way.

The invention is explained in more detail below with reference to the Figures, with mutually corresponding components provided with identical reference symbols.

BRIEF DESCRIPTION OF THE DRAWINGS

FIG. 8 depicts a diagrammatic cross section transversely with respect to the x direction through a transistor cell architecture processed in accordance with a second exemplary embodiment in a first production phase.

FIG. 9 depicts a diagrammatic cross section transversely with respect to the x direction through a transistor cell architecture processed in accordance with the second exemplary embodiment in a second production phase.

FIGS. 11A, 11B, and 11C depict a simplified plan view, diagrammatic cross sections along an x direction, and transverse to the x direction of a transistor cell architecture, respectively, processed in accordance with the third exemplary embodiment in a further production step.

DETAILED DESCRIPTION OF THE PREFERRED EMBODIMENTS

Figure 1:
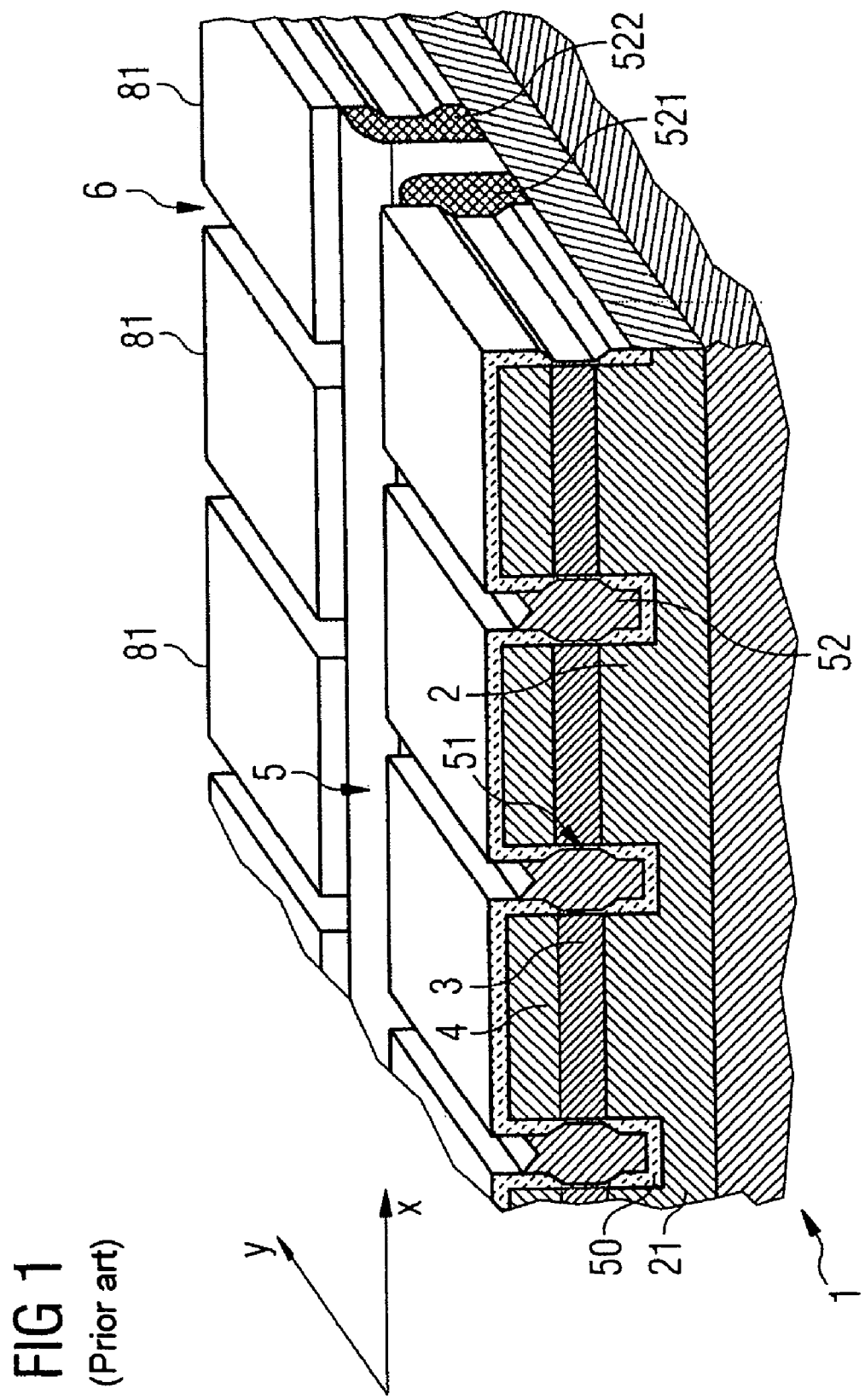
FIG. 1 depicts a diagrammatic perspective illustration of a known architecture of transistor cells in a substrate.
Figure 2:
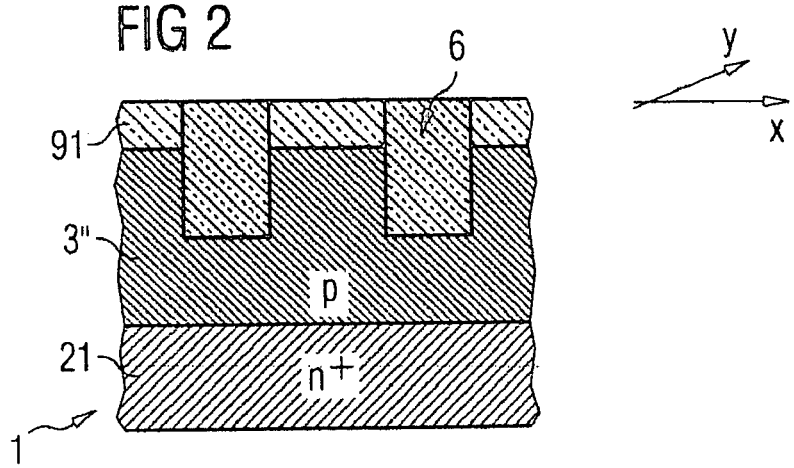
FIG. 2 depicts a diagrammatic cross section along an x direction through a transistor cell architecture processed in accordance with a first exemplary embodiment of a method according to the invention in a first production phase.

The following list of reference symbols is used consistently in the discussion to follow.
1 Substrate
2 Lower source/drain connection region
21 Connection plate (buried layer)
3 Active region
3' Layer body
3" Precursor layer body
31 First epitaxial layer
32 Second epitaxial layer
33 Transistor web
4 Upper source/drain connection region
4' Preliminary stage of the upper source/drain connection region
5 Active trench
50 Insulator layer
51 Gate dielectric
52 Gate electrode
521, 522 Word line
53 Word line insulator (inter wordline fill)
6 Isolation trench
71 Process layer
81 Transistor cell (selection transistor)
82 Storage capacitor
91 Working layer
92 Mask FIGS. 2 to 7 illustrate the fabrication of a transistor cell architecture according to a first exemplary embodiment of the present invention at various steps, using cross sections and a perspective illustration of the transistor cell architecture Firstly, as illustrated in FIG. 2, a weakly p-doped epitaxial layer, which forms a precursor layer body 3", is provided by in-situ doping of a silicon layer deposed on a connection plate 21, the latter formed as an n-doped layer in a substrate 1. A working layer 91, typically made of silicon nitride, is deposited on the precursor layer body 3". Shallow isolation trenches 6 are formed in a first lithographic step. Isolation trenches 6 extend parallel to one another along a y direction. The depth of shallow isolation trenches 6 is dimensioned such that the shallow isolation trenches 6 do not reach connection plate 21 and end in the region of precursor layer body 3". Precursor layer body 3" is thus preserved in a contiguous fashion in a lower region after the formation of shallow isolation trenches 6. In an upper region, precursor layer body 3" is patterned by isolation trenches 6. Isolation trenches 6 are filled with a dielectric, typically silicon oxide. The state of the processed transistor cell architecture after isolation trenches 6 have been filled with a dielectric is illustrated in simplified fashion in FIG. 2, which displays a cross section along an x direction perpendicular to the y direction.

Figure 3:
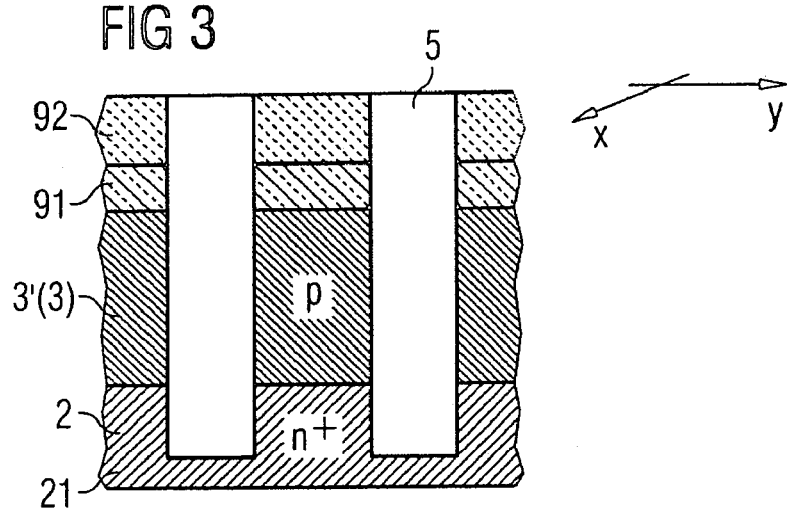
FIG. 3 depicts a diagrammatic cross section transversely with respect to the x direction through a transistor cell architecture processed in accordance with the first exemplary embodiment in the first production phase.

FIG. 3 illustrates a cross section perpendicular to the x direction after a subsequent formation of deep active trenches 5. For the formation of active trenches 5, firstly a mask 92, typically a borosilicate glass (BSG), is applied to working layer 91, so that a line of deep active trenches 5 running perpendicular to the line of shallow isolation trenches 6 along the x direction are formed in a second lithographic step. Active trenches 5 extend into the connection plate 21 and pattern connection plate 21 in an upper region. In this case, lower source/drain connection regions 2 emerge from the upper sections of connection plate 21, and layer bodies 3' separated from one another by active trenches 5 emerge from precursor layer body 3" of FIG. 2. Each layer body 3' forms an active region 3 of a transistor cell between in each case two isolation trenches 6 which are adjacent within a row.

Figure 4:
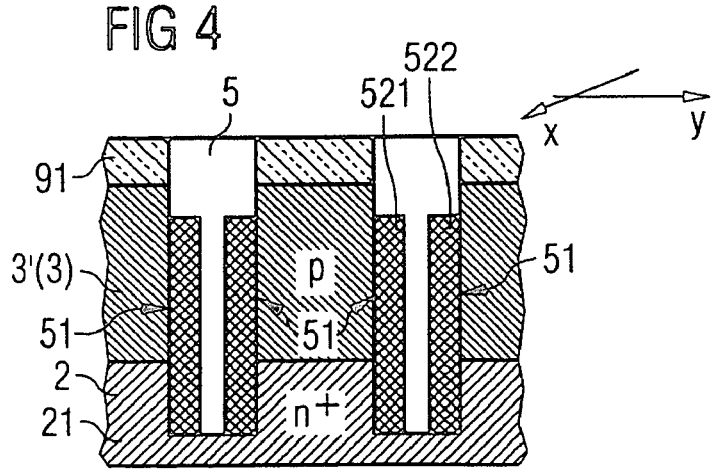
FIG. 4 depicts a diagrammatic cross section transversely with respect to the x direction through a transistor cell architecture processed in accordance with the first exemplary embodiment in a second production phase.

Afterward, a gate dielectric 51, generally an oxide, is deposited or produced at the inner walls of active trenches 5. Two mutually insulated word lines 521, 522 are then produced in a known manner, for instance by means of a conformal deposition of a conductive material and a subsequent isotropic etching of the deposited material at the inner walls of active trenches 5. Word lines 521, 522 extend in the x direction along active trenches 5. Between two respectively adjacent shallow isolation trenches 6, two sections of word lines 521, 522 which are respectively opposite each other at an active region 3 form gate electrodes of a transistor cell. FIG. 4 depicts the state of the transistor cell architecture after the formation of word lines 521, 522 and the removal of mask 92.

After the formation of word lines 521, active trenches 5 are filled with a word line insulator (inter wordline fill) 53. By means of a chemical mechanical polishing step (CMP), for example, residual sections of mask 92 and working layer 91 are removed approximately as far as the upper edge of active regions 3. Upper source/drain connection regions 4 of transistor cells 81 are subsequently formed using known processes.

Figure 5:
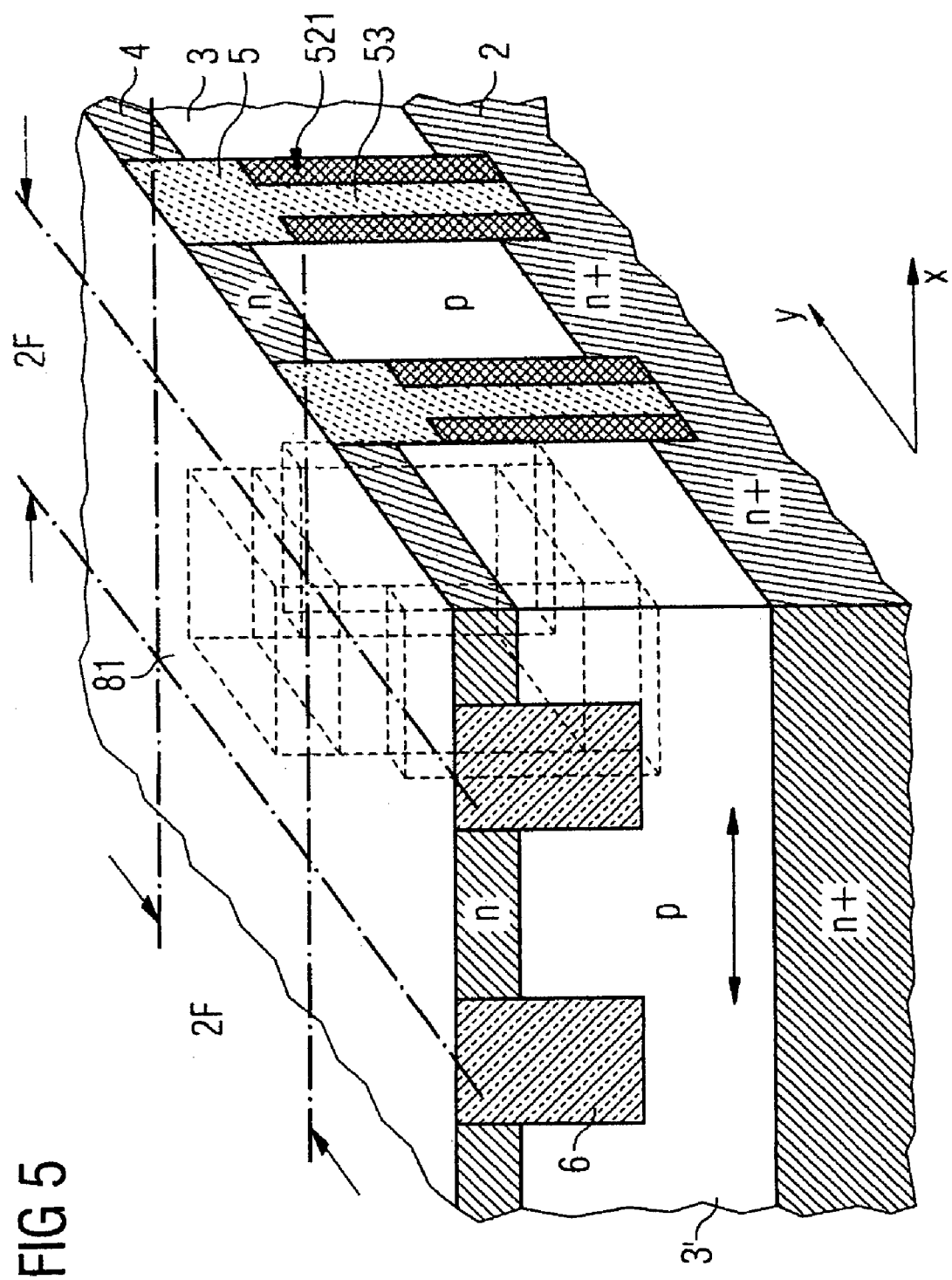
FIG. 5 depicts a diagrammatic perspective illustration of a transistor cell architecture processed in accordance with the first exemplary embodiment in a third production phase.

The resulting architecture of transistor cells 81 is shown in simplified fashion in a perspective illustration in FIG. 5. If a transistor cell 81 is fabricated according to a lithography-determined minimum feature size F, then an area requirement of $4 F^2$ results for transistor cell 81, as can be observed directly from FIG. 5. Lower source/drain connection regions 2 of transistor cells 81 are sections of contiguous connection plate 21 which is patterned in an upper region. Active regions 3 of transistor cells 81 which are adjacent in the x direction are connected to one another, since the shallow isolation trenches 6 do not extend as far as connection plate 21, so that charge carriers which otherwise accumulate in the active regions 3 can flow away in layer body 3' along the x direction. Outside a transistor cell array formed by transistor cells 81, contiguous active regions 3 which run parallel may be connected in a suitable manner, thereby ensuring that charge carriers are continuously transported away from active regions 3 and avoiding a disadvantageous accumulation of charge carriers in active regions 3.

Figure 6:
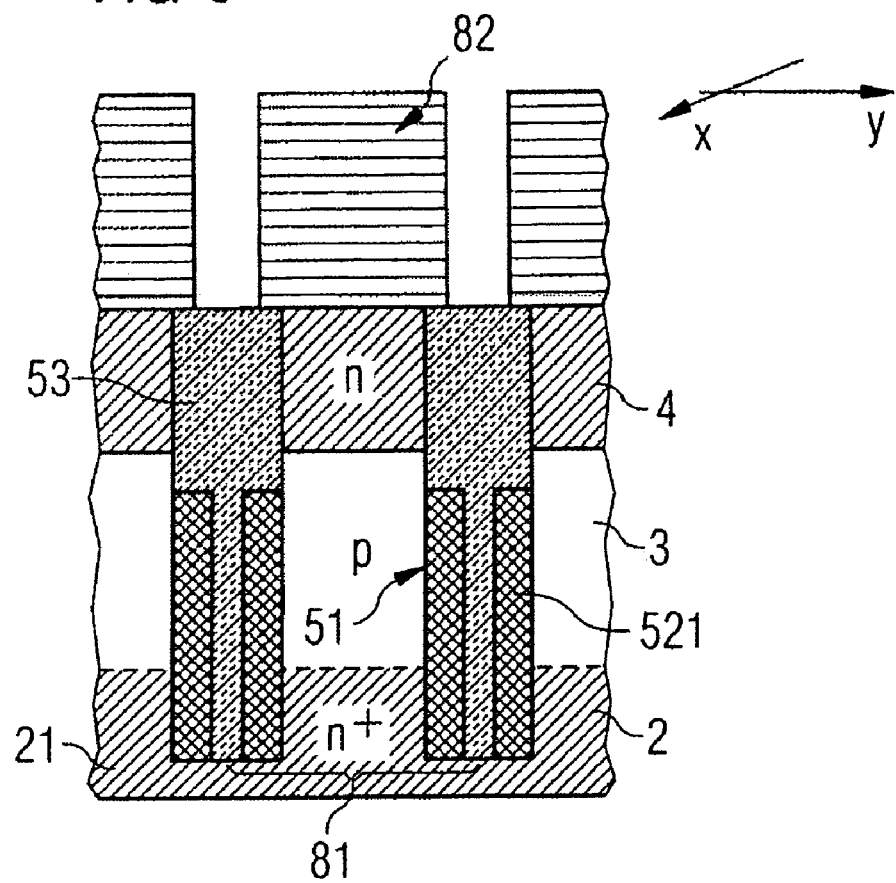
FIG. 6 depicts a diagrammatic cross section transversely with respect to the x direction through a memory cell architecture processed in accordance with the first exemplary embodiment in a fourth production phase.

An extension of the transistor cell architecture used to form a memory cell architecture is illustrated in simplified fashion in FIG. 6. In this case, a memory cell comprises a transistor cell 81 and a storage capacitor 82. Transistor cell 81 is connected to an electrode of storage capacitor 82 via upper source/drain connection region 4.

Figure 7:
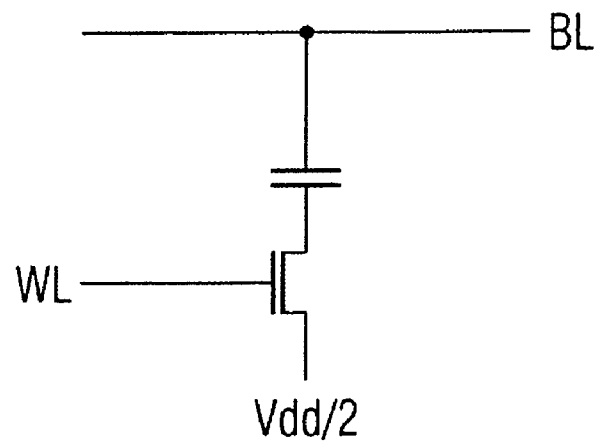
FIG. 7 depicts a diagrammatic circuit diagram of a memory cell.

The circuit concept (plate line sensing) on which the memory cell of FIG. 6 is based is illustrated diagrammatically in FIG. 7. In this case, the connection WL of FIG. 7 corresponds to one of word lines 521, 522. The bit lines BL are formed above storage capacitors 82. The potential Vdd/2 is applied to connection plate 21.

A further method for fabricating a transistor cell according to another exemplary embodiment of the present invention is described with reference to FIG. 8 and FIG. 9. In this case, the formation of transistor cells 81 proceeds from an n-doped layer of a substrate 1, which layer is provided as a common electrical connection of the transistor cells arranged to form a transistor cell array (common plate line) and forms a connection plate 21. A layer which is initially undoped or only weakly p-doped is arranged above n-doped connection plate 21, from which layer active regions 3 and lower source/drain connection regions 2 of transistor cells 81 emerge in the course of fabrication. The undoped (or weakly p-doped) layer forms a precursor layer body 3", either produced by means of an epitaxial method or from a monocrystalline semiconductor material of substrate 1. In precursor layer body 3", firstly active trenches 5 are formed along an x direction and isolation trenches of essentially the same depth are formed in a y direction perpendicular to the x direction. In this case, active trenches 5 and the isolation trenches end within precursor layer body 3" and do not reach connection plate 21. Active trenches 5 extending along the x direction are provided with a larger width, for example, more than double the width of the isolation trenches extending along the y direction. Precursor layer body 3" initially remains unpatterned in a lower region below trenches 5, 6. In an upper region, semiconductor webs isolated from one another by trenches 5, 6 are formed in precursor layer body 3", which webs have a longitudinal extent of, for example, twice the minimum feature size F in the x direction and a transverse extent of about 0.8 F in the y direction. In this exemplary embodiment, the width of the active trenches is 2 F and the width of the isolation trenches is 0.8 F.

Afterward, a process layer 71 is deposited, for instance by means of plasma enhanced chemical vapor deposition (PECVD), onto precursor layer body 3" patterned by trenches 5, 6. The material of process layer 71, typically silicon nitride, is provided with a larger thickness on the semiconductor webs than at the bottom of active trenches 5. In this case, the narrow isolation trenches are essentially covered by process layer 71 growing on the semiconductor webs while wide active trenches 5 are not completely covered. In an exemplary embodiment, process layer 71 is deposited in such a way that it protrudes from the semiconductor webs to an extent in each case of at least 0.4 F, but preferably 0.6 F, over adjacent isolation trenches 6 and active trenches 5. In this case, isolation trenches 6 having a width of 0.8 F are reliably overgrown, while active trenches 5 having a width of 2 F remain open. If necessary, portions of process layer 71 are removed from the bottom region of wide active trenches 5 in a subsequent etching step, while the bottom region of the narrow isolation trenches remains covered by process layer 71 which has grown together above the semiconductor webs over the isolation trenches. By means of a subsequent implantation step which takes place perpendicular to the transistor plane, lower source/drain connection regions 2 are formed in sections of precursor layer body 3" located below active trenches 5, said source/ drain connection regions in each case adjoining connection plate 21. In an exemplary embodiment, the source drain regions are formed using arsenic ion implantation at about 100 to 200 keV, for gate structures of 70 nm.

FIG. 8 illustrates the state of two transistor cells 81 which are adjacent in the y direction after the implantation of lower source/drain connection regions 2 in a cross section perpendicular to the y direction. Layer bodies 3' isolated from one another by lower source/drain connection regions 2 have emerged from precursor layer body 3", which layer bodies in each case extend row by row below the semiconductor webs along the x direction.

After the removal of process layer 71, in a known manner, a gate dielectric (not shown) is produced at least in sections at the walls of active trenches 5, optionally also at the walls of isolation trenches 6. A conductive material is then deposited conformally, preferably with a thickness of 0.6 F, for example, for the exemplary embodiment, in order to form the gate electrodes. Afterward, the conductive material is caused to recede by means of an isotropic etching step to an extent such that the conductive material remains along vertical side areas of the semiconductor webs (spacer etch). In this case, the narrow isolation trenches which isolate transistor cells 81 from one another in the x direction, are filled by the gate electrode material at least to an extent such that gate electrodes 52 of transistor cells 81 which are adjacent in the x direction adjoin one another and word lines 521 extending along the x direction are formed. In this case, gate electrodes 52 or word lines 521 do not completely cover the side areas of the semiconductor webs, but rather extend from a height of the semiconductor webs which is determined by the deposition process for the gate electrode material and the subsequent etching step as far as the bottom of trenches 5, 6. The upper region of the semiconductor web which is not enclosed by gate electrodes 521 can thereby subsequently be formed, by means of an inclined implantation, as a respective upper source/drain connection region 4 of the respective transistor cell 81. In this case, the inclined implantation is effected in a self-aligned manner with respect to gate electrodes 52 or with respect to word lines 521. In layer bodies 3', in this case, an active region 3 is formed for each transistor cell 81 between two isolation trenches 6 which are adjacent in the x direction (see FIG. 5) and between lower and upper source/drain connection regions 2, 4.

Subsequently, the state of the transistor cell architecture illustrated diagrammatically in FIG. 9 results after active trenches 5 have been filled with a word line insulator (inter wordline fill) and removal of excess material deposited above an upper edge of upper source/drain connection regions 4.

In order to form a memory cell, a storage capacitor is subsequently arranged on upper source/drain connection region 4 in a known manner.

FIGS. 10 to 15 illustrate various steps of a method applicable to both transistor cell architecture and memory cell fabrication according to an exemplary embodiment of the present invention. In this case, a transistor cell is produced with a gate structure in which two sections of a gate electrode are formed at two opposite side areas of an active region (double gate transistor, or DGT).

For this purpose, firstly, in a layer of a substrate 1, an n-doped layer is created by means of implantation, forming a connection plate 21 (common plate line, buried layer) used for the common connection of the transistor cells to be produced. A first epitaxial layer 31 is provided on connection plate 21, in which layer lower source/drain connection regions 2 are formed in the course of a first lithographic step and a masked implantation. In this case, lower source/drain connection regions 2 each adjoin connection plate 21 and are formed for instance as conical or cylindrical vertical structures which project through first epitaxial layer 31 in insular fashion. The non-doped sections of first epitaxial layer 31 form a contiguous first section of a layer body 3'.

Figure 10A:
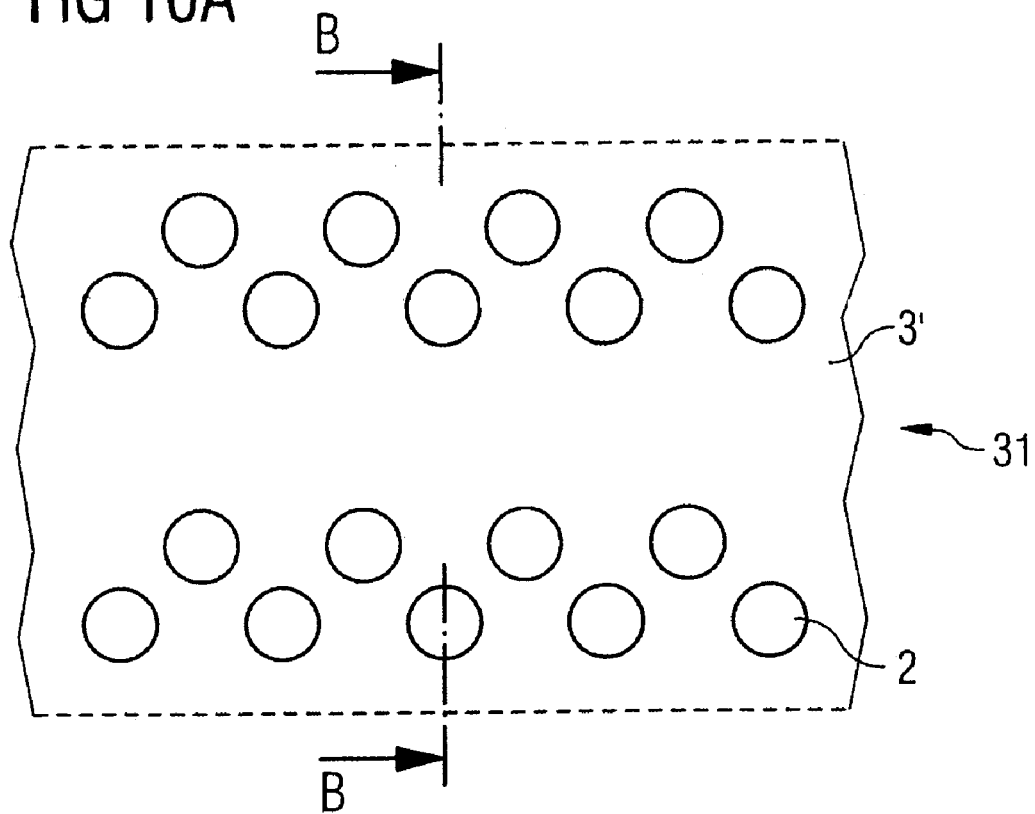
FIG. 10A and 10B depict a simplified plan view and a diagrammatic cross section transversely with respect to the x direction of a transistor cell architecture processed in accordance with a third exemplary embodiment in a first production phase.

FIG. 10A illustrates first epitaxial layer 31 with lower source/drain connection regions 2 and the contiguous first section of layer body 3' in plan view.

Figure 10B:
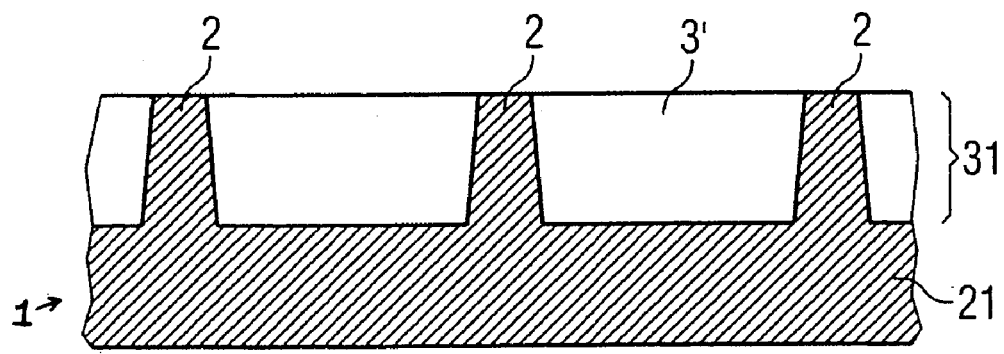

FIG. 10B depicts a cross section through first epitaxial layer 31 arranged on connection plate 21, in which layer lower source/drain connection regions 2 and the first section of layer body 3' are formed in sections.

As illustrated in FIGS. 11A–C, a second epitaxial layer 32 is then grown, the thickness of which defines a channel length KL of the transistor cells to be produced.

FIG. 11A shows a plan view of lower source/drain connection regions 2 covered by second epitaxial layer 32.

FIGS. 11B and 11C show cross sections through second epitaxial layer 32 arranged on first epitaxial layer 31 and layer body 3' encompassing second epitaxial layer 32 and the sections of first epitaxial layer 31 which are not formed as lower source/drain connection regions 2.

Figure 12A:
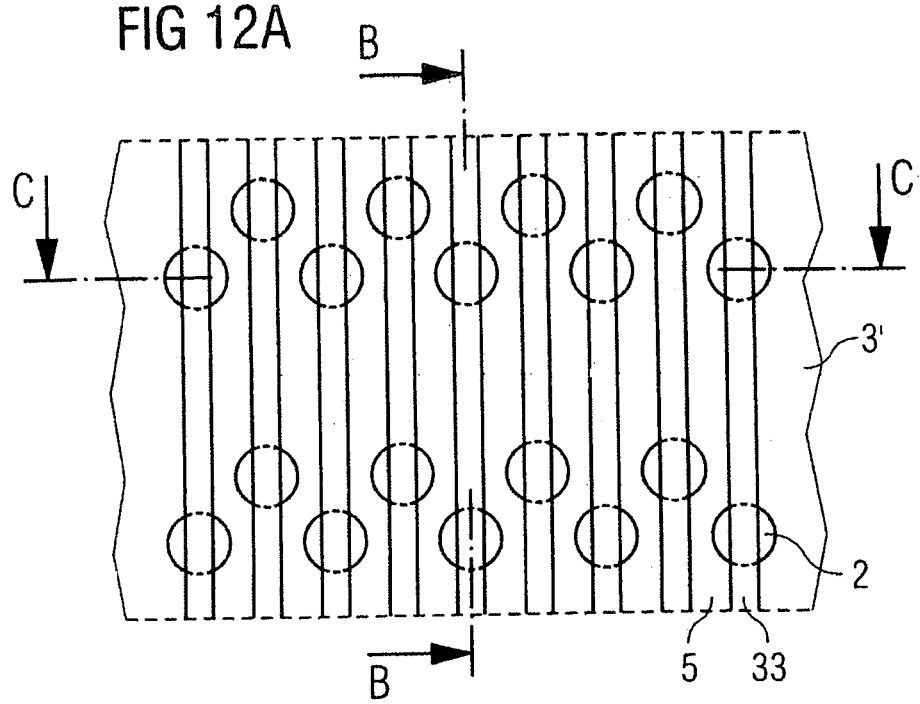
FIGS. 12A, 12B, and 12C depict a simplified plan view, diagrammatic cross sections along an x direction, and transverse to the x direction of a transistor cell architecture, respectively, processed in accordance with the third exemplary embodiment in a further production step.
Figure 12B:
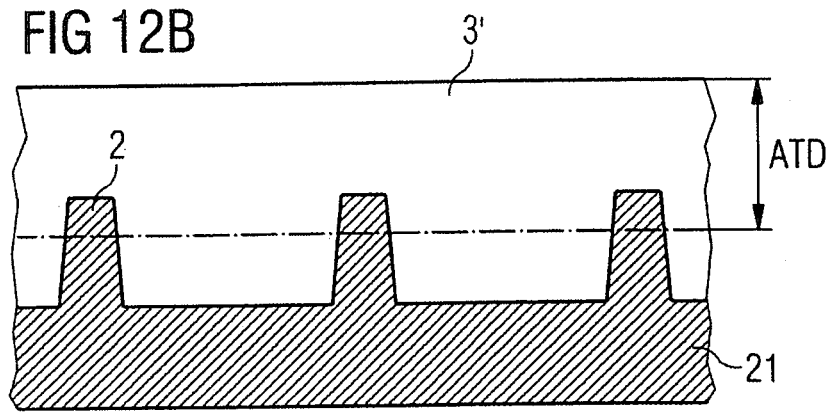
Figure 12C:
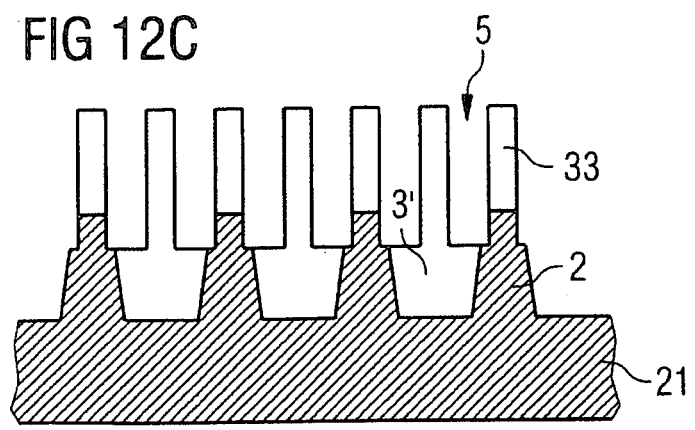

FIGS. 12A–C illustrate the state of the resulting transistor cell architecture after introduction of active trenches 5 performed in a subsequent step.

Active trenches 5 are introduced into epitaxial layers 31, 32 from the surface of second epitaxial layer 32. The depth ATD of active trenches 5 is greater than the channel length KL. Between active trenches 5, semiconductor webs 33 remain in the upper region of layer body 3'. Active trenches 5 are aligned relative to lower source/drain connection regions 2 in such a way that semiconductor webs 33 rest on lower source/drain connection regions 2 which are adjacent in each case in an x direction. In this case, significant portions of lower source/drain connection regions 2 may respectively project into semiconductor webs 33 from below.

FIGS. 12A–C reveal the architecture of active trenches 5 and additionally that of semiconductor webs 33 relative to lower source/drain connection regions 2. Lower source/drain connection regions 2, which are adjacent in each case in the x direction, are partially made free by two active trenches 5 which are adjacent in the y direction perpendicular to the x direction.

FIG. 12B illustrates a cross section through the architecture along the x direction. The depth ATD of active trenches 5 is greater than the channel length KL. lower source/drain connection regions 2 thus project into semiconductor webs 33.

FIG. 12C shows a cross section through the architecture of FIG. 12 perpendicular to the x direction.

Proceeding from FIG. 12C, and illustrated in FIG. 13, a gate dielectric 51 is then formed at the side walls of semiconductor webs 33, for instance by growth or deposition of an oxide. Afterward, two mutually insulated gate electrodes 52 or word lines 521 are formed at the mutually opposite longitudinal sides of active trenches 5 in a known manner. In an exemplary embodiment, the gate electrodes are formed by conformal deposition of a gate electrode material and a subsequent isotropic etching-back. In this case, sections of word lines 521 which extend along the x direction along active trenches 5 respectively act as gate electrodes 52 of respectively assigned transistor cell 81. Active trenches 5 are then filled with a word line insulator (inter wordline fill) 53. In order to form upper source/drain connection regions 4, firstly word line insulator 53 and gate electrodes 52 are etched back. In a further implantation step, upper sections of semiconductor webs 33 are n-doped, thus forming a preliminary stage 4' of upper source/drain connection regions 4 of transistor cells 81. Afterward, active trenches 5 are filled completely with the word line insulator.

Figure 13A:
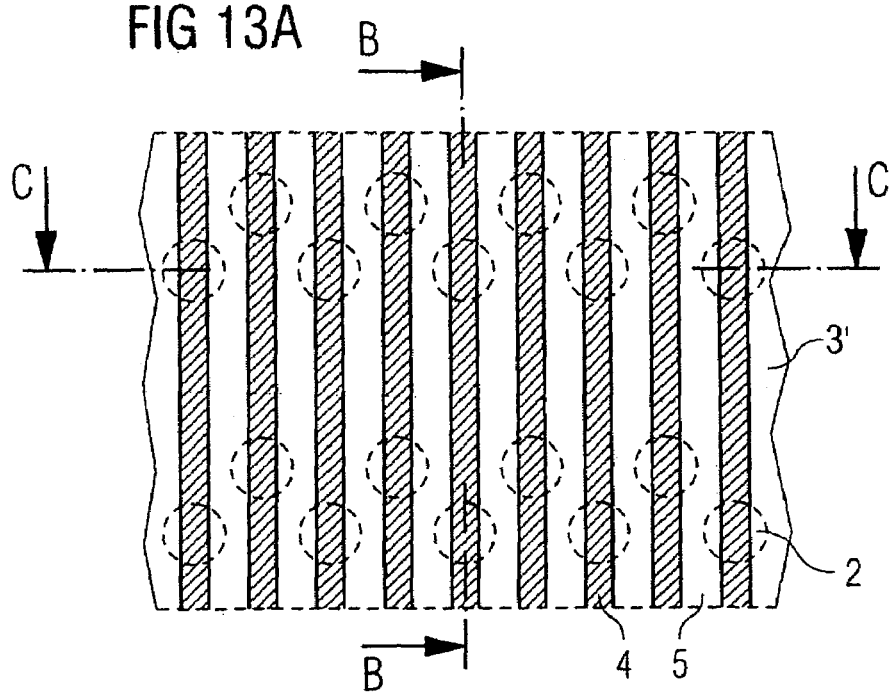
FIGS. 13A, 13B, and 13C depict a simplified plan view, diagrammatic cross sections along an x direction, and transverse to the x direction of a transistor cell architecture, respectively, processed in accordance with the third exemplary embodiment in a further production step.
Figure 13B:
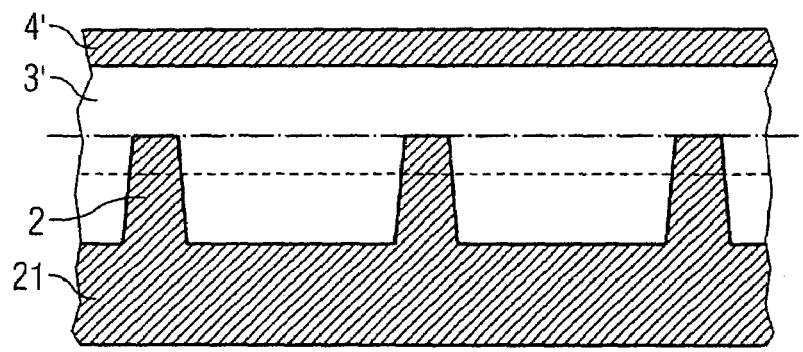
Figure 13C:
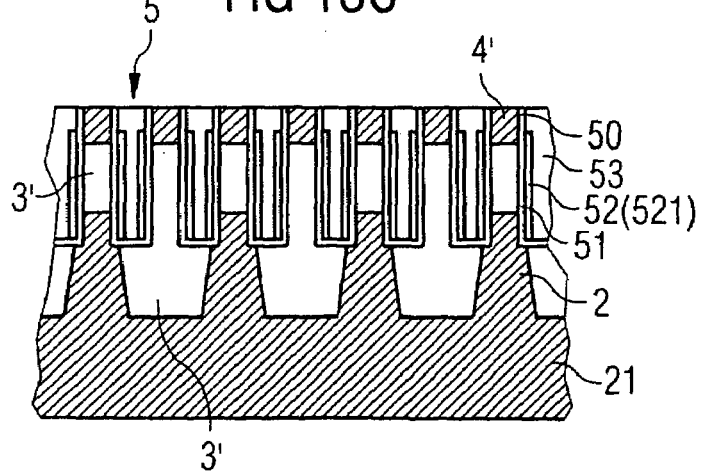

The resulting architecture can be seen from FIG. 13C, which illustrates active trenches 5 in cross section. In this case, active trenches 5 are lined with a gate dielectric 51. A word line 521 is respectively formed at the side walls of active trenches 5. The trenches are completely filled with a word line insulator 53. Preliminary stages 4' of upper source/drain connection regions 4 have been formed in the upper region of semiconductor webs 33 of FIG. 12C.

FIG. 13B furthermore reveals that active regions 3 of transistor cells 81 that are adjacent in each case in the x direction and the y direction are sections of a layer body 3', which is contiguous in the lower region and are therefore connected to one another.

FIG. 13A furthermore reveals that, at this step, the preliminary stages 4' of the upper source/drain connection regions are still unpatterned in the y direction.

Figure 14A:
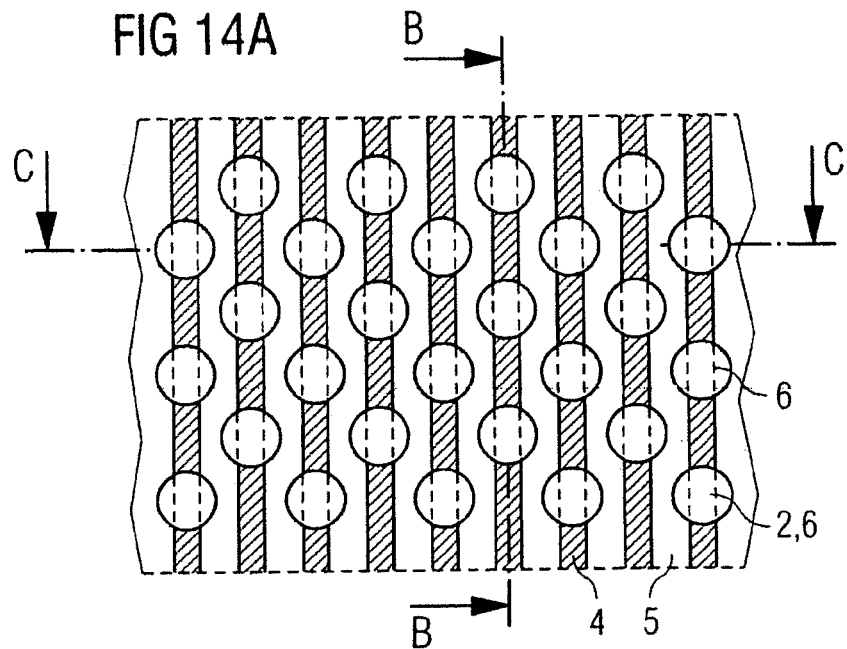
FIGS. 14A, 14B, and 14C depict a simplified plan view, diagrammatic cross sections along an x direction, and transverse to the x direction of a transistor cell architecture, respectively, processed in accordance with the third exemplary embodiment in a further production step.
Figure 14B:
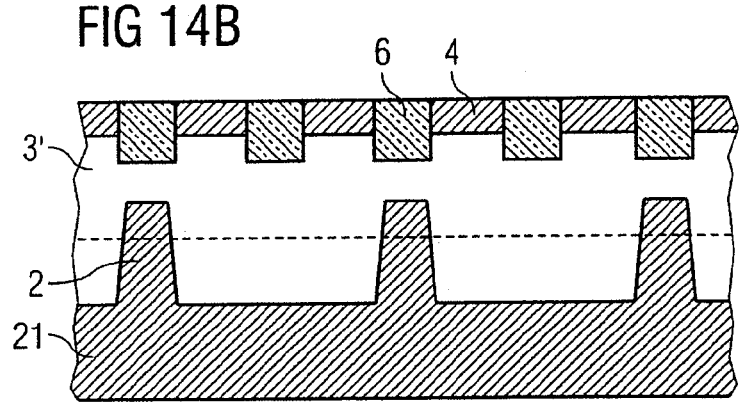
Figure 14C:
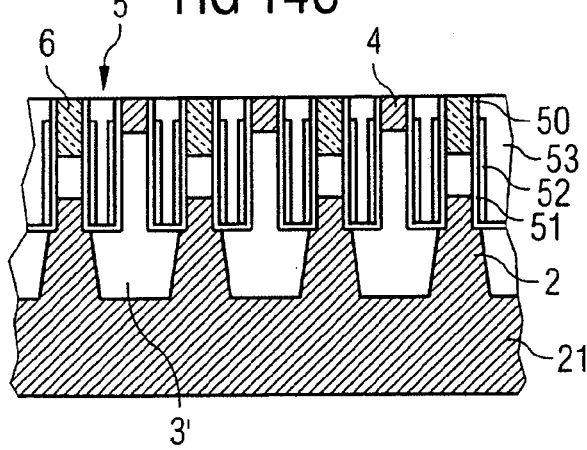
Figure 15A:
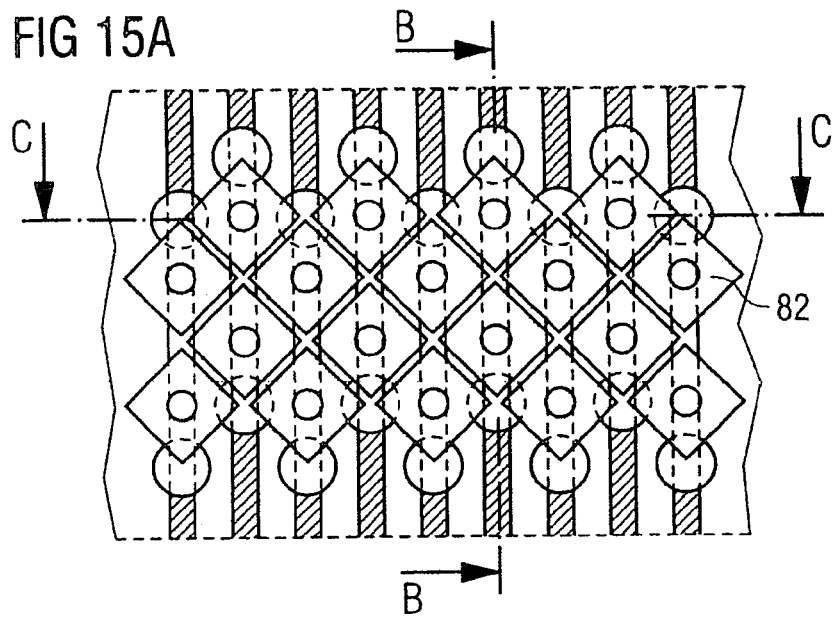
FIGS. 15A, 15B, and 15C depict a simplified plan view, diagrammatic cross sections along an x direction, and transverse to the x direction of a transistor cell architecture, respectively, processed in accordance with the third exemplary embodiment in a further production step.
Figure 15B:
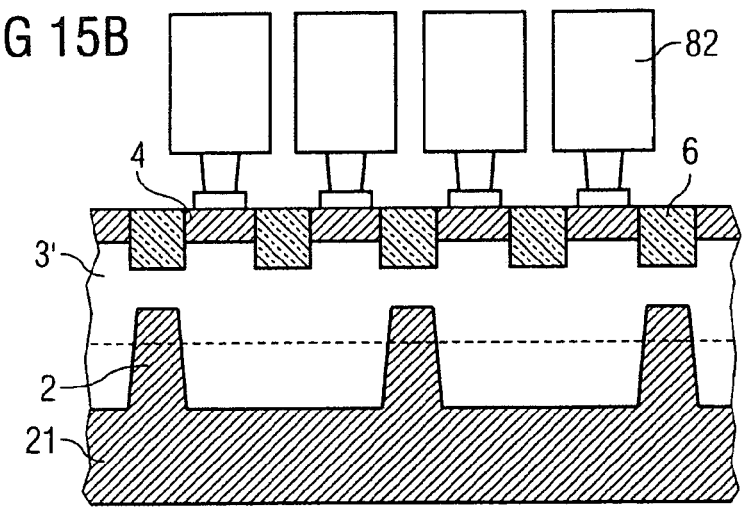
Figure 15C:
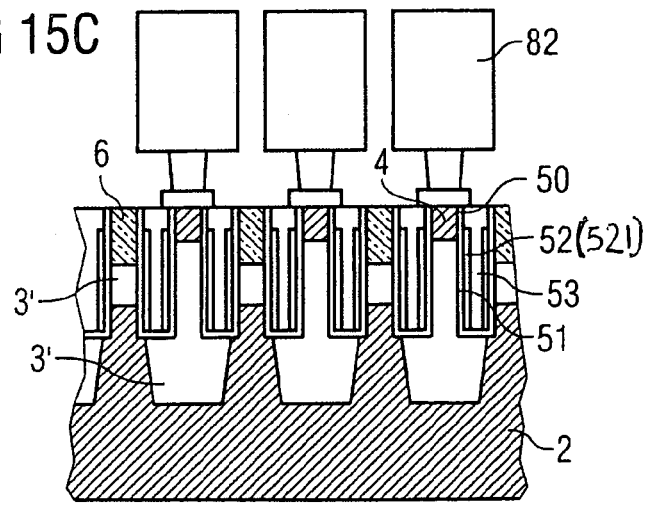

FIGS. 14A–C reveal one possibility for the patterning of upper source/drain connection regions 4 according to an exemplary embodiment of the present invention. In this case, the patterning is done by the introduction of isolation trenches 6 into preliminary stage 4' of the upper source/drain connection regions, resulting in the emergence of upper source/drain connection regions 4. In this case, isolation trenches 6 are provided with a depth which is greater than the extent of upper source/drain connection regions 4 into the depth of the substrate. The arrangement of the isolation trenches 6 may be produced to correspond to the architecture of lower source/drain connection regions 2, and in a manner dependent on an arrangement of storage capacitors 82 formed in a subsequent step as illustrated in FIGS. 15A–C. In this exemplary embodiment, first isolation trenches 6 are in each case arranged above lower source/drain connection regions 2. In the detail of this exemplary embodiment shown, an additional isolation trench 6 is in each case provided between two first isolation trenches 6.

Isolation trenches 6 are introduced either non-material-selectively in accordance with FIG. 14A or, in accordance with FIG. 14C, selectively with respect to the filling material of active trenches 5 in the semiconductor material of upper source/drain connection regions 4 or layer body 3'.

In an exemplary embodiment of the present invention, FIGS. 15A–C illustrate one possibility for the positioning of storage capacitors: in plan view in FIG. 15A and in two mutually orthogonal cross sections in FIG. 15B and FIG. 15C. In this case, the storage capacitors are formed as stacked capacitors according to a known type.

The memory cell illustrated in FIGS. 15A–C comprises a storage capacitor 82 and a transistor cell 81. Transistor cell 81 has a lower source/drain connection region 2 and an upper source/drain connection region 4, which delimit an active region 3 in each case in the vertical direction. Lower source/drain connection region 2 imparts a connection to a common connection structure of transistor cells 81, connection plate 21. Upper source/drain connection region 4 imparts an electrical connection to storage capacitor 82. Lying opposite active region 3 of a transistor cell 81 are gate electrodes 52 on a gate dielectric 51 in active trenches 5. An electrical potential at gate electrodes 52 controls the formation of a conductive channel in active region 3. Gate electrodes 52 of transistor cells 81, which are adjacent along active trenches 5, are formed in sections by continuous word lines 521. Word lines 521 respectively opposite an active region 3 are driven jointly. Transistor cells 81, which are adjacent in the longitudinal direction of active trenches 5, are separated from one another by isolation trenches 6. Active regions 3 of all transistor cells 81 are sections of a contiguous layer body 3'.

FIGS. 16A–C and 17A–C illustrate important steps of a method for fabricating a transistor cell architecture according to an exemplary embodiment of the present invention. In this case, a transistor cell with a gate structure is produced where the gate electrodes essentially completely surround an active region of the transistor cell (surrounding gate transistor, or SGT).

In this case, the initial processing up to and including the formation of active trenches 5 corresponds to steps illustrated in FIG. 10 to FIG. 12.

In a departure from the preceding exemplary embodiment, a protective coating (not illustrated) is then deposited onto the surface of layer body 3' patterned by active trenches 5, followed by the deposition of a mask 92, comprising, for instance, borophosphosilicate glass. In this case, active trenches 5 are temporarily filled with the mask material. Afterward, mask 92 is patterned in accordance with the desired architecture of isolation trenches 6, followed by introduction of isolation trenches 6 into layer body 3' by means of an etching process using mask 92.

Figure 16A:
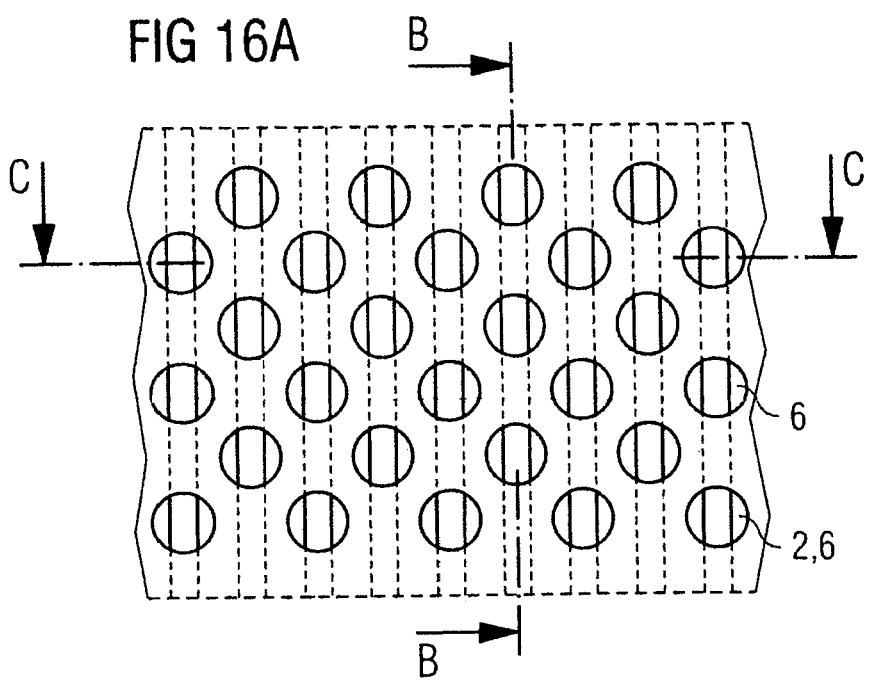
FIGS. 16A, 16B, and 16C depict a simplified plan view, diagrammatic cross sections along an x direction, and a cross section transverse to the x direction, respectively of a transistor cell architecture processed in accordance with a fourth exemplary embodiment at a certain process step.

FIG. 16A shows the resulting architecture after the introduction of isolation trenches 6 into layer body 3' in plan view, with mask 92 omitted. The architecture of isolation trenches 6 relative to lower source/drain connection regions 2 is produced in a manner corresponding to the architecture of lower source/drain connection regions 2, and is dependent, for instance, on an architecture of storage capacitors formed subsequently. In this exemplary embodiment, as in a preceding exemplary embodiment, first isolation trenches 6 are in each case provided above lower source/drain connection regions 2. Furthermore, in the detail of this exemplary embodiment shown, an additional isolation trench 6 is in each case provided between two first isolation trenches 6.

Figure 16B:
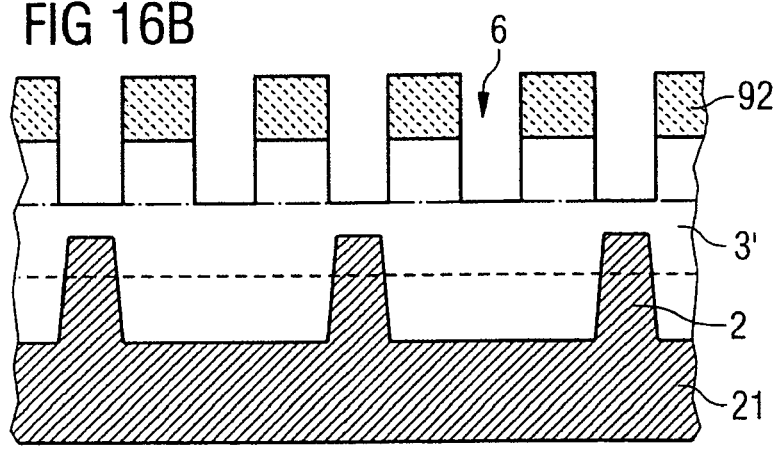

FIG. 16B reveals that isolation trenches 6 are in this case provided with a depth which is greater than the extent of upper source/drain connection regions 4 yet to be formed (FIG. 17).

Figure 16C:
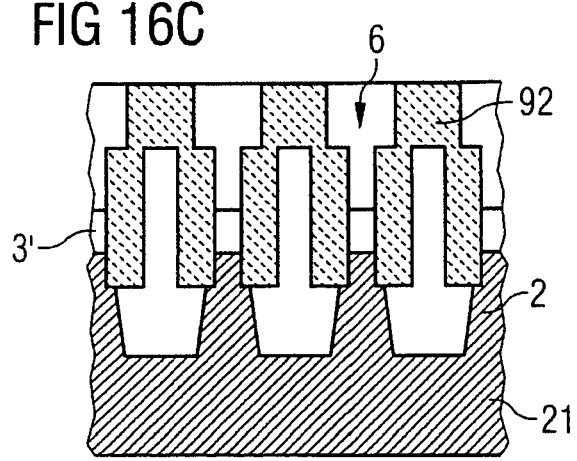

FIG. 16C reveals that isolation trenches 6 are introduced selectively into the semiconductor material of layer body 3'.

After the shaping of isolation trenches 6, residual sections of mask 92 and also the protective coating are removed. As depicted in FIG. 17, both in active trenches 5 and in isolation trenches 6 a gate dielectric 51, gate electrodes 52, and also a word line insulator 53, are provided, and upper source/drain connection regions 4 are formed from upper sections of layer body 3'.

Figure 17A:
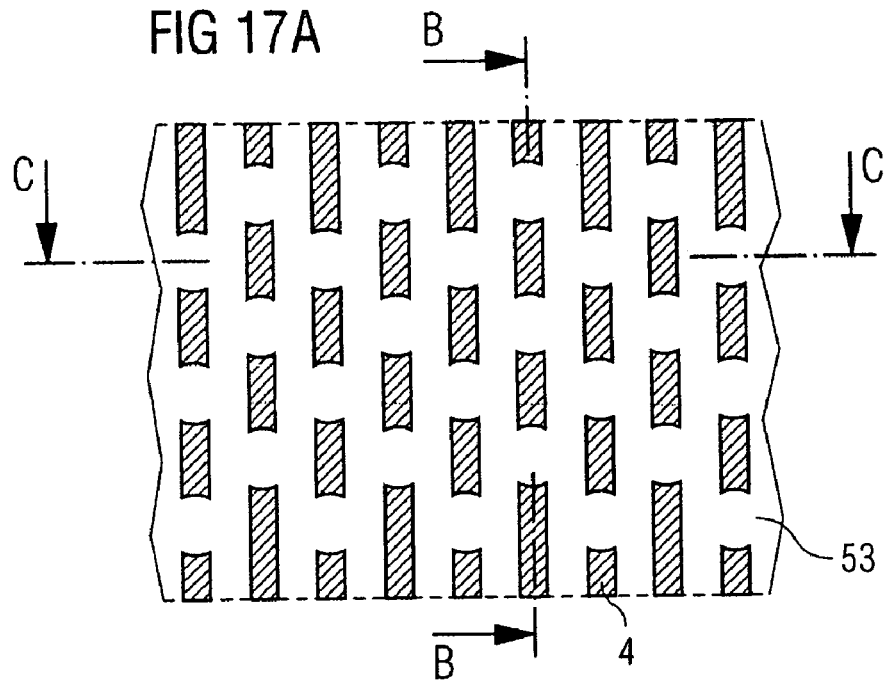
FIGS. 17A, 17B, and 17C depict a simplified plan view, diagrammatic cross sections along an x direction, and a cross section transverse to the x direction, respectively a transistor cell architecture processed in accordance with a fourth exemplary embodiment at a later process step.

FIG. 17A shows a plan view of the architecture after portions of word line insulator 53, formed temporarily above the upper edge of upper source/drain connection regions 4, have been caused to recede. The uncovered upper source/drain connection regions 4 are embedded in word line insulator 53.

Figure 17B:
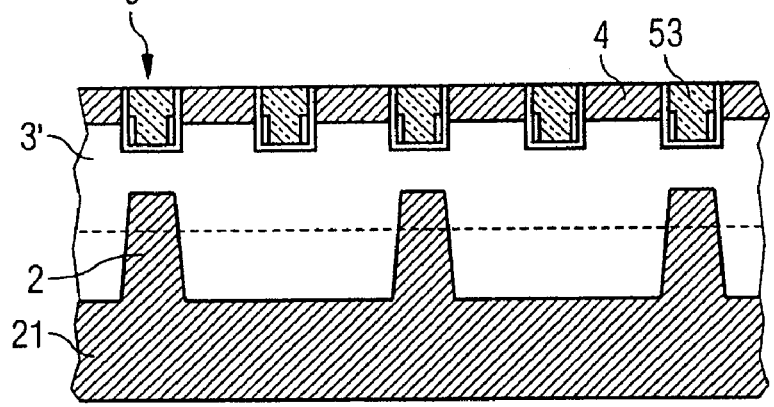
Figure 17C:
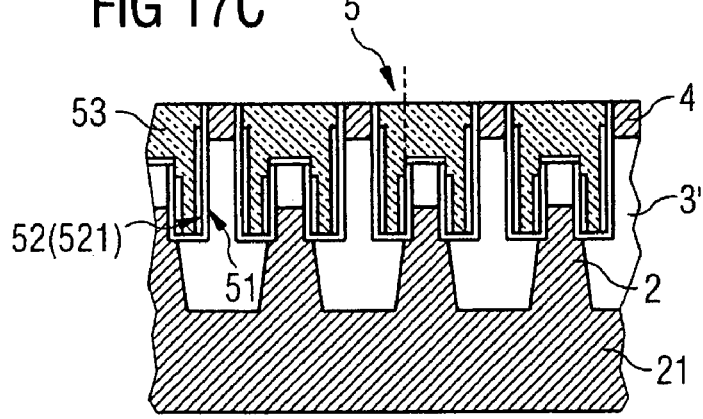

FIGS. 17B and 17C furthermore reveal that active regions 3 formed in layer body 3' and respectively assigned to a transistor cell, are in each case enclosed from four sides by gate electrodes arranged in active trenches 5 and isolation trenches 6. Finally, it furthermore emerges from FIG. 17 that active regions 3 of the transistor cells of a transistor cell array are in each case sections of contiguous layer body 3'.

Accordingly, exemplary embodiments of the present invention provide an architecture for transistor and memory cells arranged in a vertical fashion. The connection between the active regions of adjacent transistor cells can be realized in different ways. In a preferred way, the active regions are sections of one or a plurality of layer bodies. In this case, the layer body is patterned by the active trenches and the isolation trenches in an upper region. In a lower region, a layer body connects the active regions of transistor cells which are adjacent to one another at least in the x direction.

If a plurality of layer bodies are formed row by row, and the layer bodies are preferably lengthened row by row into a connection array adjoining the transistor cell array.

In the region of the connection array, the layer bodies are connected to one another, thereby also enabling a charge carrier transport between transistor cells which are adjacent in the y direction.

In a particularly preferred way, the layer bodies are individually or jointly connected to a structure whose potential is controlled in the operating state of the transistor cell such that an accumulation of charge carriers in the active regions or the layer body or bodies is avoided. In the simplest case, the potential is the potential of a carrier substrate (bulk).

The lower source/drain connection regions of the transistor cells are in each case connected to a contiguous connection plate or are particularly preferably in each case sections of a connection plate which is patterned at least in an upper region and is contiguous in a lower region.

According to a first preferred embodiment of the present invention, an architecture comprises a connection plate patterned in an upper region by the active trenches extending along the x direction. Thus, lower source/drain connection regions extending along the x direction are formed in the upper region of the connection plate. The isolation trenches running along the y direction have a smaller depth than the active trenches. Therefore, the layer bodies are formed contiguously row by row in each case in a lower region below the isolation trenches.

Further sections of the gate electrodes may be arranged in the isolation trenches. However, the isolation trenches are preferably filled with an insulator material. This results in a significantly simplified process flow for the fabrication of the transistor architecture.

According to a second preferred embodiment of the present invention, an architecture comprises isolation trenches and active trenches that have an essentially identical depth. The connection plate again has, in an upper region, lower source/drain connection regions extending along the x axis, the source/drain connection regions essentially being arranged below the active trenches in the case of this embodiment. The layer bodies are formed contiguously row by row in each case below the active regions and are separated from one another by the lower source/drain connection regions and the active trenches. The advantage of this architecture resides in the simplification of processing, since the lower source/drain connection regions can be formed in a self-aligned manner with respect to the active trenches for instance by implantation.

The architecture enables the connection of the active regions in the context of the boundary conditions which are necessary for a minimum area requirement of the transistor cell. Thus, the active regions of the transistor cells preferably have a cross-sectional area of essentially 1 $F^2$ relative to a production-dictated minimum feature size F parallel to the transistor plane. The area requirement of a transistor cell is then essentially 4 $F^2$.

According to a further particularly preferred embodiment of the present invention, the connection plate is patterned in an upper region both in the x direction and in the y direction, so that a lower source/drain connection region which is delimited in the x direction and the y direction is in each case formed in the upper region per transistor cell. The layer body then forms, by means of the extent of the transistor cell array in the lower region, a contiguous layer broken by the lower source/drain connection regions, so that the active regions both of transistor cells which are adjacent in the x direction and of transistor cells which are adjacent in the y direction are connected to one another.

This architecture produces improved electrical behavior compared with the first-mentioned preferred embodiments. Since the charge carrier transport from the active regions does not add up row by row, the reciprocal influencing of transistor cells by the charge carrier transport through the active regions remains comparatively low.

A transistor cell array formed according to exemplary embodiments of the present invention is suitable for instance for the architecture of selection transistors in a memory cell array, where each memory cell of the memory cell array has, in addition to a selection transistor, a storage capacitor for storing electrical charge. In this case, the storage capacitor is respectively connected to the selection transistor via one of the source/drain connection regions. In this case, the storage capacitor is preferably connected to the upper source/drain connection region of the selection transistor. This results in a "stacked capacitor" design for the memory cell, in which the storage capacitor is embodied above a transistor plane formed by the selection transistors. For such an architecture, it is also known to form the lower source/drain connection regions as sections of a connection plate formed in the substrate The architecture according to embodiments of the present invention enables a minimum pitch of the bit lines, in particular, by virtue of the particular structure of the word lines. Consequently, given a pitch of the word and bit lines of in each case 2 F, in accordance with the assigned exemplary embodiment, the area requirement of the memory cell given simultaneous connection of the active region is limited to 8 $F^2$. In this design, the architecture according embodiments of the present invention also enables an arrangement of bit and word lines as are required for the folded bit line circuitry.

The active regions furthermore have a geometry with a large aspect ratio in the lateral dimensions, with a high degree of scalability.

For small feature sizes F, a complete depletion of the active regions is possible, thereby considerably improving the electrical properties of the transistor cells.

In this case, the connection plate is provided in the substrate as a layer of a first conduction type and the precursor layer body is provided as a layer of a second conduction type, opposite to the first conduction type, arranged on the connection plate.

In this case, it is preferred for an n conduction type to be provided as the first conduction type and a p conduction type to be provided as the second conduction type. The connection plate then emerges, for instance, from a heavy n-type doping of a layer of the substrate, while the precursor layer body is arranged on the connection plate by means of an epitaxial method.

In this method, the active regions are connected in a particularly simple manner by virtue of the fact that the isolation trenches which separate the transistor cells arranged within a row have a smaller depth than the active trenches and do not cut through the layer bodies. The layer bodies, from whose upper regions the active regions are formed in each case, are not severed in the lower region within a row.

In another exemplary embodiment of the present invention, a method for fabricating vertical transistor cells in a substrate, comprises arranging the transistor cells in an array, in rows along an x direction, and in columns along a y direction perpendicular to the x direction, where firstly a conductive connection plate is provided in the substrate, with a precursor layer body being arranged on the connection plate.

Active trenches running along the x direction and having a first width are introduced into an upper region of the precursor layer body. Afterward, lower source/drain connection regions extending as far as the connection plate are in each case formed in sections of the precursor layer body which are arranged below the active trenches. In this case, layer bodies separated from one another by the active trenches and the lower source/drain connection regions emerge from the precursor layer body. Active regions of the transistor cells which are connected to one another by means of the lower regions of the layer bodies row by row are formed from the upper regions of the layer bodies. The isolation trenches which separate transistor cells which are adjacent in the x direction may in this case be provided with the same depth as the active trenches. If, in the further course of the processing, gate electrode structures are then provided both in the active trenches and in the isolation trenches, then the gate electrode structures advantageously encompass the active region between the two source/drain connection regions virtually completely from four sides.

In this case, the lower source/drain connection regions are preferably formed selectively in sections of the precursor layer body which are arranged below the active trenches. For this purpose, the isolation trenches running along the y direction and having a second width, which is less than the first width of the active trenches, are in each case introduced into the upper region of the layer bodies. Transistor webs delimited by the active trenches and the isolation trenches are thereby formed in each case in the upper regions of the layer bodies. Subsequently, for instance by means of a plasma enhanced chemical vapor deposition (PECVD) with a high deposition rate, a non conformal working layer is deposited, which grows more rapidly on the transistor webs than in the active trenches and isolation trenches. The deposition process is terminated as soon as sections of the isolation trenches which in each case lie between transistor webs which are adjacent in the x direction are covered by the working layer growing on the transistor webs. In this way, the working layer forms a mask with which the lower source/drain connection regions can be formed selectively in the sections of the precursor layer body which are arranged below the active trenches.

In this case, the lower source/drain connection regions are formed in the sections of the precursor layer body which are situated below the active trenches preferably by means of an ion implantation. The lower source/drain connection regions are provided such that they extend as far as the connection plate. The active regions of transistor cells which are adjacent in the x direction remain contiguously connected to one another in each case by sections of the respective layer body which are situated below the transistor webs.

Preferably, the connection plate is provided in the substrate as a layer of a first conduction type.

In particular, the n conduction type is provided as the first conduction type and the connection plate is formed by means of a heavy n-type doping of the respective layer of the substrate.

During the patterning of the upper region of the connection plate, preferably a first portion of the layer body is arranged on the connection plate, which is initially still unpatterned in the region of the transistor cell array, for instance, using an epitaxial method. Afterwards, sections of the first portion of the layer body are doped in accordance with the conductivity type of the connection plate, the lower source/drain connection regions emerging from the doped sections of the layer body. The second portion of the layer body is thereupon provided, for instance once again by means of an epitaxial method.

In this case, the doping is preferably effected by means of a plurality of implantation steps having a different implantation energy.

Active trenches extending in the x direction are then introduced into the layer body and transistor webs are produced between the active trenches in this case. In this case, the active trenches are introduced in such a way that the lower source/drain connection regions which are adjacent in each case in the x direction are respectively assigned to a transistor web. The lower source/drain connection regions at least adjoin the transistor web or project into the lower part thereof. The lower source/drain connection regions are preferably formed in conical fashion.

What is claimed is:

1. The vertical transistor architecture, comprising:
   an array of vertical transistor cells formed in a substrate and arranged in a transistor plane, in rows in an x direction, and in columns in a y direction perpendicular to the x direction;
   an array of active trenches, wherein the active trenches separate the rows of transistor cells; and
   an array of isolation trenches, wherein the isolation trenches separate the columns of transistor cells;
   wherein active regions at least of transistor cells which are adjacent to one another in the x direction are connected to one another, whereby a charge carrier transport is made possible between the active regions of transistor cells which are adjacent in the x direction;
   wherein the vertical transistor cells comprise:
      respective lower source/drain connection region;
      respective upper source/drain connection regions arranged above the lower source drain regions;
      respective conductive channels disposed between the upper and lower source/drain connection regions; and
      respective gate electrodes insulated from the active regions by a gate dielectric;
   wherein the active regions are in each case sections of a contiguous layer body, wherein the continuous body is patterned at least by the isolation trenches in an upper region, and wherein the contiguous body in a lower region connects the active regions of transistor cells that are adjacent to one another at least in the x direction;
   wherein the vertical transistor architecture further comprises a plurality of layer bodies deposed in the transistor cell array in each case separated from one another by the active trenches.

2. The vertical transistor architecture of claim 1, wherein the gate electrodes are arranged in the active trenches and wherein the gate electrodes of transistor cells which are adjacent in the x direction are connected to one another and form sections of word lines.

3. The vertical transistor architecture of claim 1, wherein the lower source/drain connection regions are in each case connected to a contiguous connection plate.

4. The vertical transistor architecture of claim 1, wherein the lower source/drain connection regions are in each case sections of a connection plate that is patterned at least in an upper region and is contiguous in a lower region.

5. The vertical transistor architecture of claim 1, wherein the layer bodies are lengthened in each case row by row into a connection array adjoining the transistor cell array.

6. The vertical transistor architecture of claim 5, wherein the layer bodies are connected to one another in the region of the connection array.

7. The vertical transistor architecture of claim 1, wherein the layer bodies are connected to a structure having a substrate potential.

8. The vertical transistor architecture of claim 1, wherein a connection plate is patterned in an upper region by the active trenches extending along the x axis, wherein the lower source/drain connection regions are formed in the upper region of the connection plate in each case below the active regions, wherein the isolation trenches have a smaller depth than the active trenches, and wherein the layer bodies are fanned contiguously row by row in each in a lower region below the isolation trenches.

9. The vertical transistor architecture of claim 8, wherein the isolation trenches are filled with an insulator material.

10. The vertical transistor architecture of claim 1, wherein the isolation trenches and the active trenches have an essentially identical depth, wherein the lower source/drain connection regions are formed in each case in an upper region of the connection plate below the active trenches, and wherein the layer bodies are formed contiguously row by row in each case below the active regions and are separated from one another by the source/drain connection regions in a lower region.

11. The vertical transistor architecture of claim 1, wherein an upper region of the connection plate is patterned in the x direction and in the y direction, wherein a lower source/drain connection region delimited in the x direction and the y direction is in each case formed in the upper region of the connection plate, and wherein the active regions of transistor cells which are adjacent in the x direction and the y direction are formed contiguously by a single layer body which is patterned by the lower source/drain connection regions.

12. The vertical transistor architecture of claim 11, wherein the layer body is lengthened into a connection array adjoining the transistor cell array.

13. The vertical transistor architecture of claim 11, wherein the layer body is connected to a structure having a substrate potential.

14. The vertical transistor architecture of claim 1, wherein the active regions of the transistor cells have a cross-sectional area of essentially $F^2$ relative to a production-dictated minimum feature size F parallel to the transistor plane, and wherein the area requirement of a transistor cell is essentially $4 F^2$.

15. The vertical transistor architecture of claim 1, further comprising a storage capacitor electrically connected to a source/drain connection region of each selection transistor, whereby an array of memory cells each containing a vertical selection transistor is formed.

16. The vertical transistor architecture of claim 15, wherein the selection transistors are connected to the assigned storage capacitor in each case at an upper source/drain connection region.

17. A vertical transistor architecture comprising:
   an array of vertical transistor cells formed in a substrate and arranged in a transistor plane, in rows in an x direction, and in columns in a y direction perpendicular to the x direction;
   an array of active trenches, wherein the active trenches separate the rows of transistor cells; and
   an array of isolation Wenches, wherein the isolation trenches separate the columns of transistor cells;
   wherein active regions at least of transistor cells which are adjacent to one another in the x direction are connected to one another, whereby a charge carrier transport is made possible between the active regions of transistor cells which are adjacent in the x direction;
   wherein the vertical transistor cells comprise:
      respective lower source/drain connection region;
      respective upper source/drain connection regions arranged above the lower source drain regions;
      respective conductive channels disposed between the upper and lower source/drain connection regions; and
      respective gate electrodes insulated from the active regions by a gate dielectric;

wherein the active regions are in each case sections of a contiguous layer body, wherein the contiguous body is patterned at least by the isolation trenches in an upper region, and wherein the contiguous body in a lower region connects the active regions of transistor cells that are adjacent to one another at least in the x direction; and wherein a connection plate is patterned in an upper region by the active trenches extending along the x axis, wherein the lower source/drain connection regions are formed in the upper region of the connection plate in each case below the active regions, wherein the isolation trenches have a smaller depth than the active trenches, and wherein the layer bodies are formed contiguously row by raw in each in a lower region below the isolation trenches.

18. The vertical transistor architecture of claim 17, wherein the isolation trenches are filled with an insulator material.

19. A vertical transistor architecture comprising:
an array of vertical transistor cells formed in a substrate and arranged in a transistor plane, in rows in an x direction, and in columns in a y direction perpendicular to the x direction;
an array of active trenches, wherein the active trenches separate the rows of transistor cells; and
an array of isolation trenches, wherein the isolation trenches separate the columns of transistor cells;
wherein active regions at least of transistor cells which are adjacent to one another in the x direction are connected to one another, whereby a charge carrier transport is made possible between the active regions of transistor cells which are adjacent in the x direction;
wherein the vertical transistor cells comprise:
respective lower source/drain connection region;
respective upper source/drain connection regions arranged above the lower source drain regions;
respective conductive channels disposed between the upper and lower source/drain connection regions; and
respective gate electrodes insulated from the active regions by a gate dielectric;
wherein the active regions are in each case sections of a contiguous layer body, wherein the contiguous body is patterned at least by the isolation trenches in an upper region, and wherein the contiguous body in a lower region connects the active regions of transistor cells that are adjacent to one another at least in the x direction; and wherein an upper region of a connection plate is patterned in the x direction and in the y direction, wherein a lower source/drain connection region delimited in the x direction and the y direction is in each case formed in the upper region of the connection plate, and wherein the active regions of transistor cells which are adjacent in the x direction and the y direction are formed contiguously by a single layer body which is patterned by the lower source/drain connection regions.

20. The vertical transistor architecture of claim 19, wherein the layer body is connected to a structure having a substrate potential.

* * * * *

UNITED STATES PATENT AND TRADEMARK OFFICE
CERTIFICATE OF CORRECTION

| | |
|---|---|
| PATENT NO. | : 7,109,544 B2 |
| APPLICATION NO. | : 10/777128 |
| DATED | : September 19, 2006 |
| INVENTOR(S) | : Schloesser et al. |

It is certified that error appears in the above-identified patent and that said Letters Patent is hereby corrected as shown below:

On the title page:
In the References Cited Field (56) on the coversheet, line 14, delete "2002/0109178" insert --2002/0109176--
Column 8, line 15; delete "521" insert --52--
Column 16, line 2; delete "fanned" insert --formed--
Column 16, line 52; delete "Wenches" insert --Trenches--
Column 17, line 13; delete "raw" insert --row--

Signed and Sealed this

Second Day of January, 2007

JON W. DUDAS
*Director of the United States Patent and Trademark Office*